(12) United States Patent
Ogawa et al.

(10) Patent No.: US 7,955,432 B2
(45) Date of Patent: Jun. 7, 2011

(54) PHASE MODULATION DEVICE, PHASE MODULATION DEVICE FABRICATION METHOD, CRYSTALLIZATION APPARATUS, AND CRYSTALLIZATION METHOD

(75) Inventors: Hiroyuki Ogawa, Nara (JP); Masato Hiramatsu, Tokyo (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 1285 days.

(21) Appl. No.: 11/523,567

(22) Filed: Sep. 20, 2006

(65) Prior Publication Data
US 2007/0063184 A1    Mar. 22, 2007

(30) Foreign Application Priority Data
Sep. 22, 2005 (JP) ................................ 2005-275867

(51) Int. Cl.
*C30B 1/02* (2006.01)
(52) U.S. Cl. ........................ 117/4; 117/7; 117/8; 117/9
(58) Field of Classification Search .................. 117/4, 7, 117/8, 9
See application file for complete search history.

(56) References Cited

U.S. PATENT DOCUMENTS
2004/0096753 A1* 5/2004 Jung .................................. 430/5
2005/0189542 A1* 9/2005 Kudo et al. ...................... 257/64
2006/0024981 A1* 2/2006 Nakamura et al. ............. 438/795

FOREIGN PATENT DOCUMENTS
JP     2003-173014      6/2003

OTHER PUBLICATIONS

Masakiyo Matsumura, "Preparation of Ultra-Large Grain Silicon Thin-Films by Excimer-Laser", Surface Science, vol. 21, No. 5, 2000, pp. 278-287.
Flat-Panel Display 96, Part 3-5, 1996, 4 Pages.

* cited by examiner

*Primary Examiner* — Robert M Kunemund
(74) *Attorney, Agent, or Firm* — Oblon, Spivak, McClelland, Maier & Neustadt, L.L.P.

(57) ABSTRACT

A phase shifter which modulates the phase of incident light has a light-transmitting substrate such as a glass substrate, and a phase modulator such as a concavity and convexity pattern which is formed on the laser beam incident surface of the light-transmitting substrate and modules the phase of incident light. A light-shielding portion which shields light in the peripheral portion where the optical intensity distribution decreases of the phase modulator is formed on the laser beam incident surface or exit surface of the phase shifter, thereby shielding the peripheral light in the irradiation surface of the incident laser beam.

4 Claims, 11 Drawing Sheets

| Film thickness (nm) | Crystallinity (a.u.) | | |
|---|---|---|---|
| | Al | Cr | Al-Si |
| 5 | 80 | 60 | 90 |
| 10 | 50 | 40 | 70 |
| 30 | 20 | 0 | 40 |
| 50 | 0 | 0 | 20 |
| 80 | 0 | 0 | 0 |
| 100 | 0 | 0 | 0 |
| 150 | 0 | 0 | 0 |
| 200 | 0 | 0 | 0 |
| 250 | 0 | 0 | 0 |
| 300 | 0 | 0 | 0 |
| 400 | 0 | 0 | 0 |
| 500 | 0 | 0 | 0 |
| 800 | 0 | 0 | 0 |
| 1000 | 0 | 0 | 0 |

PHASE MODULATION DEVICE, PHASE MODULATION DEVICE FABRICATION METHOD, CRYSTALLIZATION APPARATUS, AND CRYSTALLIZATION METHOD

CROSS-REFERENCE TO RELATED APPLICATIONS

This application is based upon and claims the benefit of priority from prior Japanese Patent Application No. 2005-275867, filed Sep. 22, 2005, the entire contents of which are incorporated herein by reference.

BACKGROUND OF THE INVENTION

1. Field of the Invention

The present invention relates to a phase modulation device, phase modulation device fabrication method, crystallization apparatus, and crystallization method by which annealing such as uniform crystallization can be performed.

2. Description of the Related Art

The thin-film semiconductor technique is an important technique for forming semiconductor devices such as a thin-film transistor (TFT), contact type sensor, and photoelectric conversion element on an insulating substrate. The thin-film transistor is a field-effect transistor having a MOS (MIS) structure, and is also applied to a flat panel display such as a liquid crystal display (e.g., "Surface Science", Vol. 21, No. 5, pp. 278-287).

The liquid crystal display generally has the characteristics as flatness, lightweight, and low power consumption, and can easily display color images. The liquid crystal display having these characteristics is widely used as displays of personal computers and various portable information terminals. When the liquid crystal display is an active matrix type display, thin-film transistors are used as pixel switching elements.

An active layer (carrier moving layer) of this thin-film transistor is made of, e.g., a thin silicon semiconductor film. The thin silicon semiconductor film is classified into amorphous silicon (a-Si) and polycrystalline silicon (non-single-crystal crystalline silicon) having fine crystal phases. The polycrystalline silicon is mainly polysilicon (poly-Si). Microcrystal silicon (μc-Si) is also known as the polycrystalline silicon. Examples of semiconductor thin-film materials other than silicon are SiGe, SiO, CdSe, Te, and CdS.

The carrier mobility in the active layer when a thin-film transistor is formed in polycrystalline silicon is about 10 times to 100 times as large as that when a thin-film transistor is formed in amorphous silicon. This carrier mobility characteristic is a superior characteristic as a semiconductor thin-film material for forming a TFT-structure switching element in a thin polycrystalline silicon film. Recently, a thin-film transistor using polysilicon as an active layer is noted for its high operating speed. This thin-film transistor having a high operating speed is noted as a switching element capable of forming various logic circuits such as a domino circuit and CMOS transmission gate. These logic circuits are necessary to form driving circuits of a liquid crystal display and electroluminescence display, a multiplexer, an EPROM, an EEPROM, a CCD, a RAM, and the like.

The conventional representative process of forming a thin semiconductor film made of polycrystalline silicon will be explained below. A substrate to be processed by this process has the following structure. An insulating substrate of glass or the like is prepared first. An undercoat layer (or buffer layer) such as a silicon oxide film ($SiO_2$) is formed on this insulating substrate. In addition, an amorphous silicon film (a-Si) about 50 nm thick is formed as a thin semiconductor film on the undercoat layer. After that, dehydrogenation is performed to decrease the hydrogen concentration in the amorphous silicon film. Subsequently, a cap film such as a silicon oxide film ($SiO_2$) is formed on the amorphous silicon film, thereby forming the substrate to be processed. Then, melt recrystallization of the amorphous silicon film is performed by excimer laser crystallization or the like. More specifically, an excimer laser beam irradiates the amorphous silicon film to change the amorphous silicon film in this irradiated region into a crystalline silicon film.

Presently, the thin polycrystalline silicon semiconductor film thus fabricated is used as an active layer (channel region) of an n- or p-channel thin-film transistor. In this case, the field-effect mobility (the electron or hole mobility obtained by the field effect) of the thin-film transistor is about 100 to 150 $cm^2/V \cdot sec$ for the n-channel, and 100 $cm^2/V \cdot sec$ for the p-channel. The use of this thin-film transistor makes it possible to form driving circuits such as a signal line driving circuit and scan line driving circuit on a substrate on which pixel switching elements are formed. Accordingly, a driving-circuit-intergrated display device can be obtained. As a consequence, the manufacturing cost of the display device can be reduced.

The electrical characteristics of the thin-film transistor formed on the insulating substrate are not so excellent as to integrate signal processing circuits, such as a D/A converter which converts digital video data into an analog video signal and a gate array which processes the digital video data, on the substrate of the display device. In this case, the thin-film transistor is required to have current driving capability two times to five times as high as the present capability. This thin-film transistor is also required to have a field-effect mobility of about 300 $cm^2/V \cdot sec$ or more. To improve the functions and added values of the display device, the electrical characteristics of the thin-film transistor must be further improved. For example, when a static memory formed by a thin-film transistor is to be added to each pixel in order to give the pixel a memory function, this thin-film transistor is required to have electrical characteristics equivalent to those obtained when a single-crystal semiconductor is used. Therefore, it is important to improve the characteristics of the thin semiconductor film.

As a method of improving the characteristics of the thin semiconductor film, it is possible to make the crystallinity of the thin semiconductor film approach that of a single crystal. In effect, if the thin semiconductor film can be entirely changed into a single crystal on the insulating substrate, it is possible to obtain characteristics similar to those of a device using a SOI substrate which is examined as the next-generation LSI. This attempt was made more than 10 years ago as a three-dimensional device research project. Unfortunately, no technique capable of entirely changing the thin semiconductor film into a single crystal has been established yet. However, it is presently still expected that semiconductor grains in the thin semiconductor film be a single crystal.

Conventionally, a technique which grows large single-crystal semiconductor grains during crystallization of a thin amorphous semiconductor film is proposed (e.g., "Surface Science", Vol. 21, No. 5, pp. 278-287). "Surface Science", Vol. 21, No. 5, pp. 278-287 was announced as results of the research extensively continued by Matsumura et al. This reference discloses a technique which irradiates a thin amorphous semiconductor film with an excimer laser whose intensity is spatially modulated by using a phase shifter which modulates the phase of incident light. This reference also discloses a phase modulation excimer laser crystallization method which changes that region of the thin amorphous semiconductor film, which is irradiated with the laser into a thin polysilicon film by melt recrystallization. An ordinary laser crystallization method uses a laser beam having excimer laser intensity which is averaged (homogenized) on the plane of a thin silicon film by using an optical system (homogenizing optical system) called a beam homogenizer (e.g., "Flat Panel Display 96", pp. 174-176). By contrast, the excimer laser intensity of the laser beam in the phase modulation excimer laser crystallization method disclosed in "Surface Science", Vol. 21, No. 5, pp. 278-287 is varied on the plane of a thin silicon film by using the phase shifter, thereby producing a temperature gradient corresponding to this optical intensity distribution in the thin silicon film. This temperature gradient promotes the growth of single-crystal silicon grains from a low-temperature portion to a high-temperature portion in a lateral direction parallel to the plane of the thin silicon film. Consequently, this phase modulation excimer laser crystallization method can grow large-size, single-crystal silicon grains in the crystallized region, compared to the laser crystallization method disclosed in "Flat Panel Display 96", pp. 174-176. This phase modulation excimer laser crystallization method can grow, in an amorphous silicon film, single-crystal silicon grains having a grain size of about a few μm by which one or a plurality of active elements such as thin-film transistors can be fabricated (accommodated). Accordingly, a thin-film transistor having electrical characteristics meeting the above-mentioned requirements can be obtained by forming the transistor in the single-crystal silicon grains thus grown.

The phase modulation excimer laser crystallization method disclosed in "Surface Science", Vol. 21, No. 5, pp. 278-287 is an effective technique capable of forming large-size, single-crystal silicon grains in predetermined positions. The present inventors are extensively making research and development for applying this technique to industrial uses.

In the in-plane optical intensity distribution of a laser beam emitted from a laser source, the optical intensity is a maximum near the optical axis and decreases toward the periphery. Therefore, a crystallization apparatus generally has an optical system (homogenizing optical system) which homogenizes the optical intensity distribution of a laser beam in a two-dimensional plane.

Unfortunately, even when the excimer laser intensity is averaged by using the homogenizing optical system, the light irradiation intensity still decreases in the peripheral portion of the irradiation region. If crystallization is performed using this beam irradiation region, the irradiation intensity difference produces a difference between the sizes of crystal grains in the central portion and peripheral portion.

Furthermore, in the peripheral irradiation region in which the light irradiation intensity decreases, the silicon film does not reach the melting temperature and an annular non-crystallized region remains in a region where the irradiation intensity is too low.

When irradiation is performed a plurality of number of times in an irradiation region like this, even if low-light-irradiation-intensity portions between the adjacent irradiation regions are overlapped, no crystallization is well performed in the overlapped irradiation region. Accordingly, if a channel region of a thin-film transistor is formed in this region, the characteristics of the thin-film transistor worsen. When the substrate is to be entirely crystallized, therefore, it is required to densely irradiate the adjacent irradiation regions formed by repetitive irradiation.

BRIEF SUMMARY OF THE INVENTION

The present invention has been made in consideration of the above problems, and has as its object to provide a phase shifter capable of enhancing uniformity of crystal grain sizes in an irradiation region, a method of fabricating the phase shifter, and a laser annealing apparatus.

The present invention has the following arrangements in order to achieve the above object.

A phase modulation device according to an aspect of the present invention is a phase modulation device including a light-transmitting substrate, and a concavity and convexity pattern which is formed on the light-transmitting substrate and modulates a phase of incident light, comprising a light-shielding member which is formed on at least one of an incident surface and an exit surface of the light-transmitting substrate, and shields the incident light which enters a predetermined peripheral portion of the concavity and convexity pattern and a peripheral portion of the light-transmitting substrate.

The light-shielding member is preferably at least one of a reflector, an absorber, a scatterer, and a thin film. The light-shielding member is preferably at least one of aluminum, an aluminum alloy, and chromium. The aluminum alloy is preferably an Al—Si alloy.

The film thickness of the thin film is preferably 30 to 2,000 nm. When the light-shielding member is aluminum, the film thickness of the thin film is preferably 50 to 2,000 nm. When the light-shielding member is an Al—Si film, the film thickness of the thin film is preferably 80 to 2,000 nm.

According to another aspect of the present invention, a method of fabricating a phase modulation device including a light-transmitting substrate and a modulator which modulates a phase of incident light on the light-transmitting substrate, comprises forming, on the light-transmitting substrate, light-shielding means for shielding peripheral light in an irradiation surface of the incident light to the light-transmitting substrate.

According to still another aspect of the present invention, a method of fabricating a phase modulation device including a light-transmitting substrate and a concavity and convexity pattern which modulates a phase of incident light on the light-transmitting substrate, comprises forming, on an incident surface or an exit surface of the light-transmitting substrate, a light-shielding member which shields the incident light to a predetermined peripheral portion of the concavity and convexity pattern and an outer peripheral portion of the light-transmitting substrate.

A through hole portion is preferably formed in a central portion of the light-shielding member by wet etching. The light-shielding member is preferably an annular light-shielding member.

A crystallization apparatus according to still another aspect of the present invention is a crystallization apparatus in which a laser beam from a laser source irradiates a substrate to be processed on a suscepter via a homogenizing optical system, a phase modulation device, and an image formation optical lens system, thereby crystallizing an irradiated surface, comprising light-shielding means which is formed in an optical path from an exit surface of the homogenizing optical system to an incident surface of the image formation optical lens system, and shields peripheral light of exit light from the homogenizing optical system.

A crystallization apparatus according to still another aspect of the present invention is a crystallization apparatus in which a laser beam from a laser source irradiates a substrate to be processed on a suscepter via a homogenizing optical system, a phase modulation device, and an image formation optical lens system, thereby crystallizing an irradiated surface, the phase modulation device comprising a phase modulator formed on the light-transmitting substrate, and light-shielding means which is formed in an optical path from an exit surface of the homogenizing optical system to an incident surface of the image formation optical lens system, and shields peripheral light in an irradiation surface of the incident light to the phase modulation device.

A crystallization apparatus according to still another aspect of the present invention is a crystallization apparatus in which a laser beam from a laser source irradiates a substrate to be processed on a suscepter via a homogenizing optical system, a phase modulation device, and an image formation optical lens system, thereby crystallizing an irradiated surface, comprising light-shielding means which is formed in an optical path between an exit surface of the homogenizing optical system and the image formation optical lens system, and shields peripheral light whose optical intensity is low on the exit surface of the homogenizing optical system.

A crystallization method according to still another aspect of the present invention is a crystallization method in which a laser beam from a laser source irradiates a substrate to be processed on a suscepter via a homogenizing optical system, a phase modulation device, and an image formation optical lens system, thereby crystallizing an irradiated surface, comprising a step of forming a laser beam by shielding low-optical-intensity peripheral light of the laser beam on an exit surface of the homogenizing optical system, in an optical path between the exit surface of the homogenizing optical system and an incident surface of the image formation optical lens system.

The length of an opening of the light-shielding member in a periodic direction for the concavity and convexity pattern is preferably integral times of the length of the one concavity and convexity pattern necessary for forming one cycle of a triangle wave formed by the concavity and convexity pattern.

An optical intensity distribution of incident light shielded by the light-shielding member and phase-modulated by the concavity and convexity pattern is preferably a triangle wave configured such that the intensity in the end portion of the incident light becomes the minimum.

The concavity and convexity pattern preferably gives a periodical spatial distribution to the optical intensity of the incident light.

The present invention can make the crystal grain sizes in an irradiation region uniform. In addition, an irradiation region can be accurately defined. When irradiation is to be performed a plurality of number of times, therefore, irradiation regions can be formed as they are densely arranged.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the generation description given above and the detailed description of the embodiments given below, serve to explain the principles of the invention.

DETAILED DESCRIPTION OF THE INVENTION

Figure 1A:
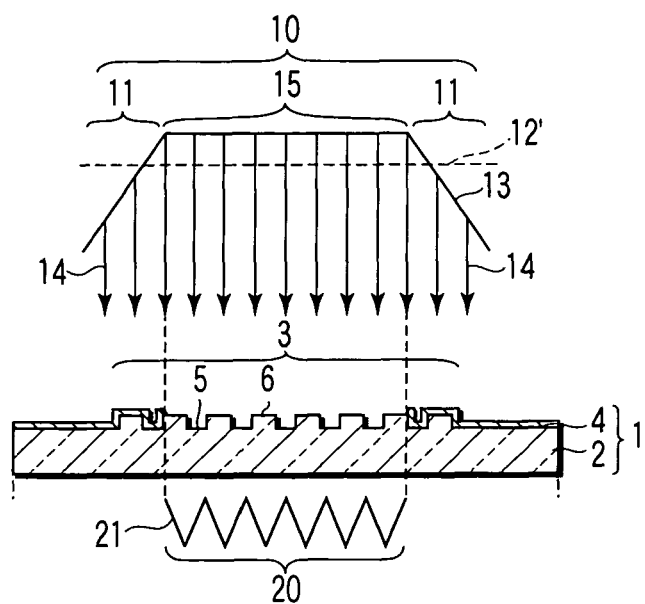
FIG. 1A is a view for explaining an embodiment of a phase shifter according to the present invention.

An embodiment of a phase modulation device, e.g., a phase shifter of the present invention will be explained below with reference to FIGS. 1A to 1D and 2A to 2D. A phase shifter 1 has a light-transmitting substrate 2, e.g., a synthetic quartz substrate having transparency to incident light, a phase modulator 3 which is formed on the light-transmitting substrate 2 and modulates the phase of the incident light by diffracting, refracting and interfering the incident light, and a light-shielding member, e.g., a light-shielding portion 4 which shields peripheral light in a predetermined irradiation surface of the phase modulator 3. The incident light is a laser beam, e.g., a pulse laser beam.

The phase modulator 3 is a region so processed as to modulate the phase of incident light by diffracting, refracting and interfering the incident light, and is a concavity and convexity pattern or the like. The concavity and convexity pattern is, e.g., a line and space pattern or a duty modulation pattern. The phase modulator 3 is obtained by forming steps on one surface of the light-transmitting substrate 2, e.g., a synthetic quartz substrate. Diffraction, refraction and interference of an incident laser beam 10 occur in the concavity 5 and convexity 6. As a consequence, a spatial distribution, i.e, a periodical spatial distribution is given to the intensity of the incident laser beam. The steps of the concavity and convexity pattern are designed as follows. When the wavelength of the incident laser beam 10 is given as λ and the refractive index of the substrate 2 is given as n, the steps t of the concavity and convexity is calculated by t=λθ/2π(n−1) in order to give a phase difference of θ.

When the phase difference of, e.g., 180° is to be given, it is calculated by t=λ/2(n−1). The concavity and convexity pattern can be formed by, e.g., etching the substrate 2.

The light-shielding member is formed on at least one of the incident surface and exit surface of the light-transmitting substrate. For example, the light-shielding portion 4 is formed on the incident surface of the substrate 2. The light-shielding member is a member which suppresses the transmitting light amount of incident light by at least one of reflection, absorption, and scattering, and need only be, e.g., a reflector, absorber, or scattering member. An embodiment of the light-shielding member may also be a thin film. The thin film is, e.g., a metal film. This metal film is at least one of, e.g., an aluminum film, aluminum alloy film, and chromium film.

The optimum film thickness of a chromium film is 30 to 2,000 nm, that of an aluminum film is 50 to 2,000 nm, and that of an aluminum alloy film, e.g., an Al—Si film is 80 to 2,000 nm. The light-shielding portion 4 is formed on one surface of the light-transmitting substrate 2, e.g., on the surface with the concavity and convexity pattern.

The relationship between the phase shifter 1 having the above arrangement and the incident laser beam 10 will be explained below. An example of the incident laser beam 10 to the phase shifter 1 is a laser beam homogenized by a homogenizing optical system. FIG. 1A is a schematic view showing an optical intensity distribution 13 of the incident laser beam 10 homogenized by a homogenizing optical system. In addition, the optical intensity at each position is indicated by the length of a vertical line 14. FIG. 1A shows that the incident laser beam 10 is composed of a laser beam 15 having the uniform optical intensity and its peripheral light 11. The peripheral light 11 is a region where the optical intensity of the incident laser beam 10 is not uniform. FIG. 1A demonstrates that the optical intensity is not completely homogenized in the section of the incident laser beam 10 even when a homogenizing optical system is used. In this specification, the peripheral light 11 is a region where the optical intensity has practically lowered in the irradiation surface of the laser beam 10. FIG. 1A shows an example in which the light-shielding portion 4 shields the peripheral light 11. Although a light-shielding region of the light-shielding portion 4 is a region where the optical intensity practically lowers, this region also includes a portion exceeding a threshold 12' where crystallization is enabled, thus actually including a region which can be crystallized.

Figure 1B:
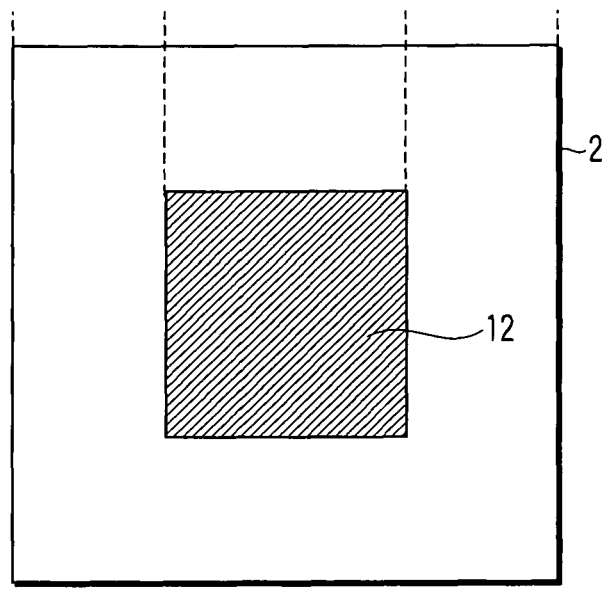
FIG. 1B is a view for explaining the embodiment of the phase shifter according to the present invention.

Referring to FIG. 1A, the positional relationship among the optical intensity distribution 13 of the incident laser beam 10, the side sectional view of the phase shifter 1, and the optical intensity distribution 21 of an irradiation laser beam 20 is indicated by the dotted lines. "Irradiation laser beam 20" means a laser beam for irradiating a substrate to be processed whose surrounding is light-shielded by the light-shielding member and whose phase is modulated by the phase shifter. FIG. 1B shows a plan view in which the phase shifter 1 is viewed from above. Referring to FIG. 1B, the irradiation region 12 which is not covered with the light-shielding portion 4 is shown and this means the region to be irradiated with the irradiation laser beam. The opening of the light-shielding portion 4 is preferably formed in a square or a polygon, as described later, in order to form densely crystals on the whole substrate through the repetitive irradiation. This square is, e.g., a regular square.

The repetitive irradiation is to execute a crystallization step by sequentially moving the substrate to be crystallized thereby changing an irradiation position on the substrate to be crystallized, when crystallizing the whole substrate larger than the irradiation region 12. In this irradiation method, the laser beam 10 sequentially striking the substrate to be crystallized can be emitted such that the peripheral portion of the irradiation region 12 of the preceding laser beam is irradiated with the succeeding laser beam 10 in an adjacent way. In other irradiation methods, the same position may be irradiated with the preceding and succeeding laser beam 10 a plurality of number of times, or irradiation positions may also partially overlap each other.

The light-shielding substrate 2 of the phase shifter 1 is formed by, e.g., a synthetic quartz substrate. On one surface, e.g., the incident surface of this synthetic quartz substrate, the phase modulator 3 having a concavity and convexity pattern which changes the phase of the incident laser beam 10 is formed.

The optical intensity distribution corresponding to the irradiation region 12 where the incident laser beam 10 is uniform has a good optical intensity distribution having a continuous triangular section by a phase shift effect.

For example, the optical intensity distribution 21 formed by the phase shifter 1 has an optical intensity distribution of an inverse peak pattern as shown in FIG. 1A. The inverse peak pattern means a triangle wave constituted such that the intensity becomes the maximum in the end portion of the optical intensity distribution 21. The light-shielding portion 4 can remove an optical intensity distribution region as a peripheral nonuniform portion corresponding to the peripheral light 11. If no light-shielding portion 4 is formed, a non-single-crystal semiconductor film is formed by irradiation with the laser beam 10 from the peripheral light 11. This non-single-crystal semiconductor film has a grain size and orientation entirely different from those of crystal grains of a single-crystal semiconductor film 22 crystallized in the irradiation region 12 as a uniform portion. When a transistor is formed, therefore, the electrical characteristics of the transistor worsen.

The single-crystal semiconductor film 22 does not mean a film which is completely changed into a single crystal all over the surfaces, but means a semiconductor film in which the grain sizes of crystal grains formed by crystallization are large and the orientation is uniform to some extent, and which has electrical characteristics better than those of a TFT formed in the non-single-crystal semiconductor film.

Figure 1C:
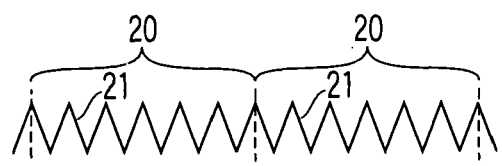
FIG. 1C is a view for explaining the embodiment of the phase shifter according to the present invention.
Figure 1D:
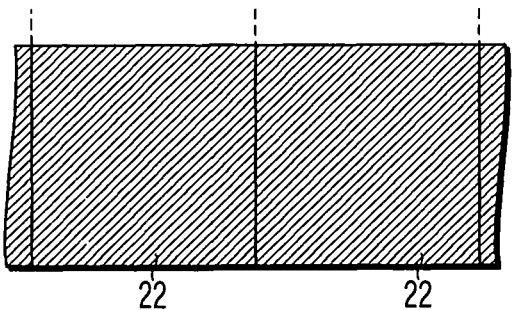
FIG. 1D is a view for explaining the embodiment of the phase shifter according to the present invention.

The phase modulation device, e.g., the phase shifter 1 of this embodiment will be explained in detail below. The phase shifter 1 is an example in which a light-shielding member, e.g., the light-shielding portion 4 which shields light in the peripheral portion as shown in FIG. 1A is formed on the surface of a synthetic quartz substrate on which the phase modulator 3, e.g., a concavity and convexity pattern 5, 6 is formed. The light-shielding portion 4 has a square through hole which transmits light in the irradiation region 12 where the optical intensity distribution is uniform as shown in FIG. 1B. The incident laser beam 10 enters the phase shifter 1 and becomes an irradiation laser beam 20 in which the laser beam 15 having the uniform optical intensity distribution or part thereof is phase-modulated. This irradiation laser beam 20 irradiates the non-single-crystal semiconductor film to be crystallized. When a continuous crystallized region is formed as shown in FIG. 1D, in the junction portion of adjacent irradiation surfaces which are sequentially irradiated, the phase shifter 1 can form a continuous triangular optical intensity distribution as shown in FIG. 1C. In order to form a continuous triangular shape, the length of the opening of the light-shielding portion 4 in a periodic direction for the concavity and convexity pattern has to be integral times of a cycle length of the concavity and convexity pattern necessary for forming one cycle of the triangle wave.

Another embodiment which shields the peripheral light 11 described above will be explained below with reference to FIGS. 2A to 2D. The same reference numerals as in FIGS. 1A to 1D denote the same parts, and a detailed explanation thereof will be omitted.

Figure 2A:
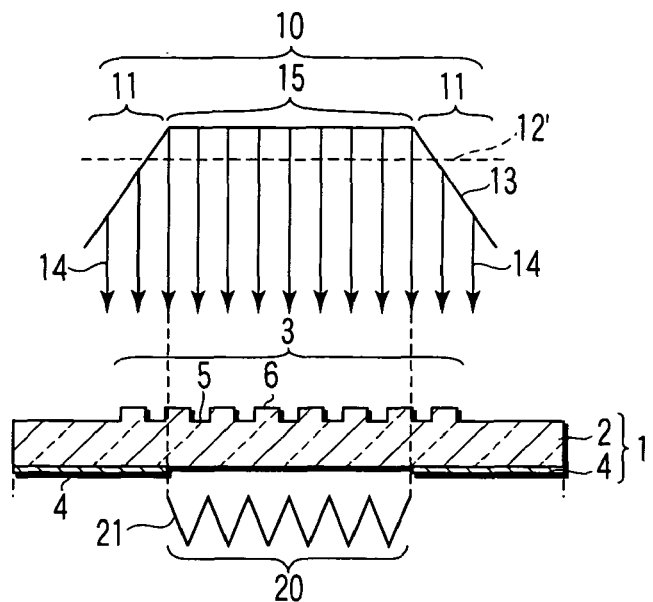
FIG. 2A is a view for explaining another embodiment of the phase shifter according to the present invention.
Figure 2B:
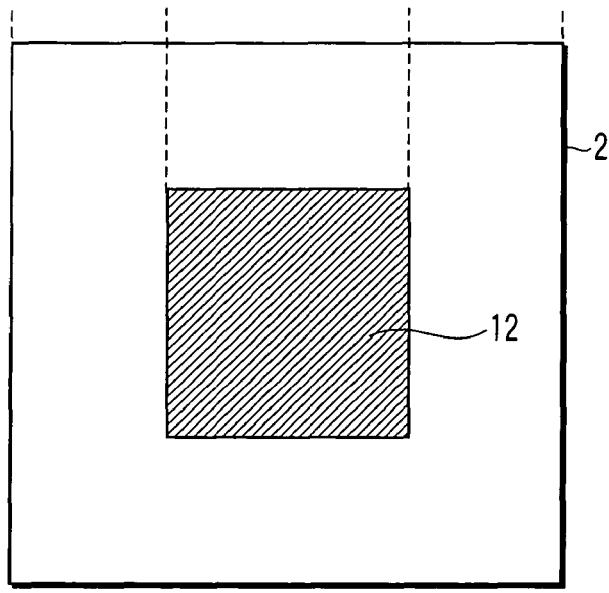
FIG. 2B is a view for explaining the other embodiment of the phase shifter according to the present invention.

As shown in FIG. 2A, a phase shifter 1 of this embodiment is obtained by forming a light-shielding portion 4 on the lower surface (exit surface), which is opposite to the surface shown in FIG. 1A, of a light-transmitting substrate 2, i.e, a synthetic quartz substrate. As shown in FIG. 2B, the light-shielding portion 4 has a square through hole which transmits the laser beam 15 or one portion thereof where the optical intensity distribution is uniform. A incident laser beam 10 as shown in FIG. 2A enters the phase shifter 1 of this embodiment, and undergoes phase modulation. Of the phase-modulated incident laser beam 10, the laser beam 15 having the uniform optical intensity distribution or one portion thereof is transmitted through the phase shifter 1, to form the irradiation region 12.

Figure 2C:
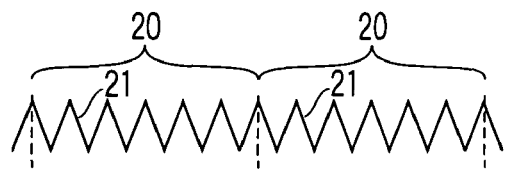
FIG. 2C is a view for explaining the other embodiment of the phase shifter according to the present invention.
Figure 2D:
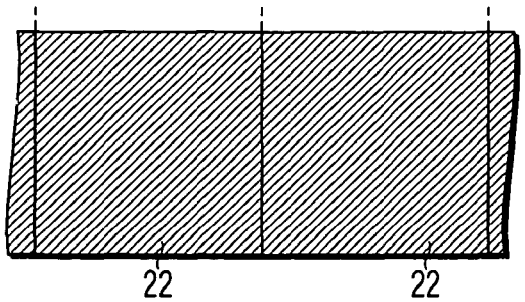
FIG. 2D is a view for explaining the other embodiment of the phase shifter according to the present invention.

Similar to FIGS. 1A to 1D, in the junction portion of adjacent irradiation surfaces which are sequentially irradiated, the phase shifter 1 has a continuous triangular optical intensity distribution as shown in FIG. 2C, and forms a continuous crystallized region as shown in FIG. 2D.

In both the embodiments shown in FIGS. 1A to 1D and 2A to 2D, the light-shielding portion 4 needs to be accurately formed in a portion corresponding to the concavity and convexity pattern of the phase shifter. In addition, as shown in FIGS. 1C, 1D, 2C, and 2D, it is possible to obtain optical characteristics in which the favorable optical intensity distribution 21 continues and no mismatch point forms. When a large substrate is to be entirely crystallized, the phase shifter 1 of each of these embodiments can easily form a crystallized region by overlapping adjacent irradiation surfaces to be sequentially irradiated. The phase shifter 1 of each of these embodiments can increase the uniformity of crystal grains because the non-single-crystal semiconductor film is irradiated with only the laser beam 10 transmitted through the irradiation region 12. In other words, the laser beam 10 transmitted through the phase shifter 1 can eliminate or narrow the polycrystal region. As shown in FIG. 1D or 2D, therefore, a uniform crystallized region having a predetermined size can be continuously formed over a broad range. Furthermore, a single-crystal semiconductor film superior in crystal grain size, orientation, and electrical characteristics can be continuously formed without producing any mismatch point such that the optical intensity distribution continues as shown in FIG. 1C or 2C.

The light-shielding portion 4 must be so formed as to correspond to a predetermined concavity and convexity pattern. "Predetermined" means that, as shown in FIG. 1B or 2B, a triangular optical intensity distribution continues over the boundary between adjacent irradiation surfaces to be sequentially irradiated without producing any mismatch point. This means that the light-shielding portion 4 is formed as it is designed on the concavity and convexity pattern or on the surface opposite to the concavity and convexity pattern. More specifically, the light-shielding portion 4 needs to have the length of the openings as many as the integral times of the cycle length of the concavity and convexity pattern necessary for forming one cycle of the continuous triangular wave. The phase shifter 1 having the light-shielding portion 4 thus formed can achieve the effect of obtaining the continuous optical intensity distribution 21 in the adjacent irradiation surfaces to be sequentially irradiated without producing any discontinuous point.

Figures 3A, 3B:
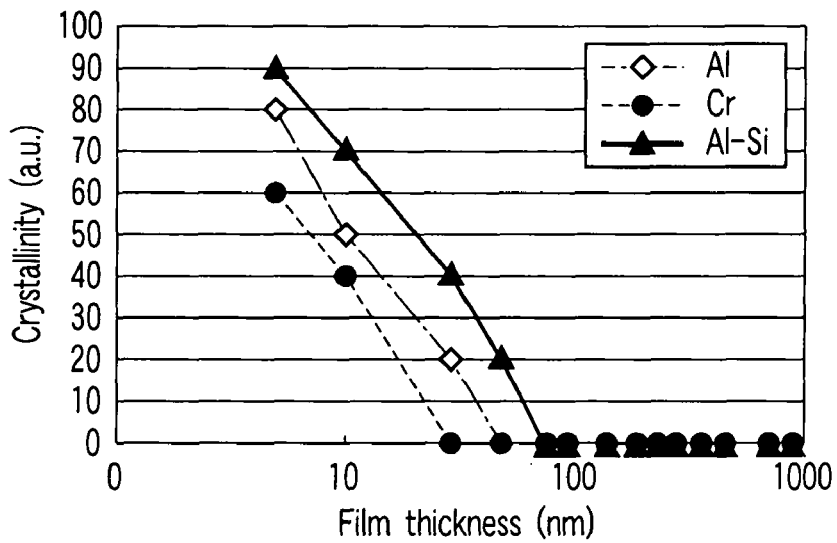
FIG. 3A is a graph for explaining the characteristics of the phase shifters shown in FIGS. 1A to 1D or 2A to 2D.
FIG. 3B is a graph for explaining the characteristics of the phase shifters shown in FIGS. 1A to 1D or 2A to 2D.

A practical example of the light-shielding member having the above characteristics will be explained below with reference to FIG. 3. FIG. 3 shows the light-shielding properties of the light-shielding portion 4 which shields the laser beam 10 having the energy for crystallization, when the film thicknesses of three types of films, i.e., an aluminum film, chromium film, and Al—Si film were changed. The light-shielding properties were evaluated by the crystallinity (measured as the ratio of the area of a crystallized region to the overall area by a transmission electron microscope (TEM)) of the non-single-crystal semiconductor film irradiated with the laser beam 10 transmitted through the light-shielding portion 4. As shown in FIG. 3, the crystallinity was shown to be zero when the light-shielding portion 4 was made of a 50-nm thick aluminum film, 30-nm thick chromium film, or 80-nm thick Al—Si film, and good light-shielding properties were obtained when they were made by these thicknesses or more.

In the above embodiments, the light-shielding means obtained by forming the thin film having light-shielding properties is described. However, the light-shielding properties need not be perfect, and it is only necessary to reduce light to such an extent that no crystallization occurs.

According to the above embodiments, when the light-shielding portion 4 of the phase shifter 1 defines the irradiation region 12, although an irradiation region on the substrate to be crystallized is narrower than that when the light-shielding portion 4 defines no irradiation region, the energy uniformity in this irradiation region increases, so the crystal grain uniformity in the irradiation region can be increased. Also, when the whole substrate to be crystallized is crystallized, it is possible to irradiate the irradiation regions adjacent to each other, correctly aligned, on the non-single-crystal semiconductor film surface whenever the pulse laser beam is emitted, and the irradiation regions can be formed as they are densely arranged. Since the optical intensity distribution 21 corresponding to the irradiation regions becomes clear, it is easy to overlap the irradiation regions with each other to do the irradiation. Therefore, according to the present invention, the irradiation regions of high uniformity can be densely arranged and irradiated on the non-single-crystal semiconductor film, even in a larger substrate.

The uniforming effect of crystal grains obtained by the above embodiments can improve the fluctuation of characteristics of a thin-film transistor (field-effect transistor), and sophisticate, in terms of functions, a semiconductor device such as a semiconductor circuit or integrated circuit formed by this thin-film transistor, and an electronic device. In addition, the above embodiments are effective techniques applicable to the technique of fabricating an electronic device such as a liquid crystal display or information processing device incorporating a thin-film transistor.

Although the crystallization apparatus is explained as an example of a laser annealing apparatus in the above embodiments, the present invention is not limited to this crystallization apparatus but also applicable to an annealing apparatus for activation. Furthermore, the phase shifter 1 is not limited to the crystallization apparatus but also applicable to an annealing apparatus for activation or an exposure apparatus.

In the above embodiments, the thin film having the light-shielding properties is formed on the light-transmitting substrate as an example of the light-shielding means. However, it is possible to use any means which prevents, from being applied to the substrate to be processed, the peripheral light 11 of the incident laser beam 10 to the phase shifter 1. For example, the incident light may also be irregularly reflected by forming a reflecting surface, such as a fine concavity and convexity surface or roughened surface, on that portion of the light-transmitting substrate, which corresponds to the low-intensity portion described above.

Furthermore, the phase modulation surface is formed on the incident surface of the phase shifter 1 in the above embodiments, but the phase modulation surface may also be formed on the exit surface.

Figure 4:
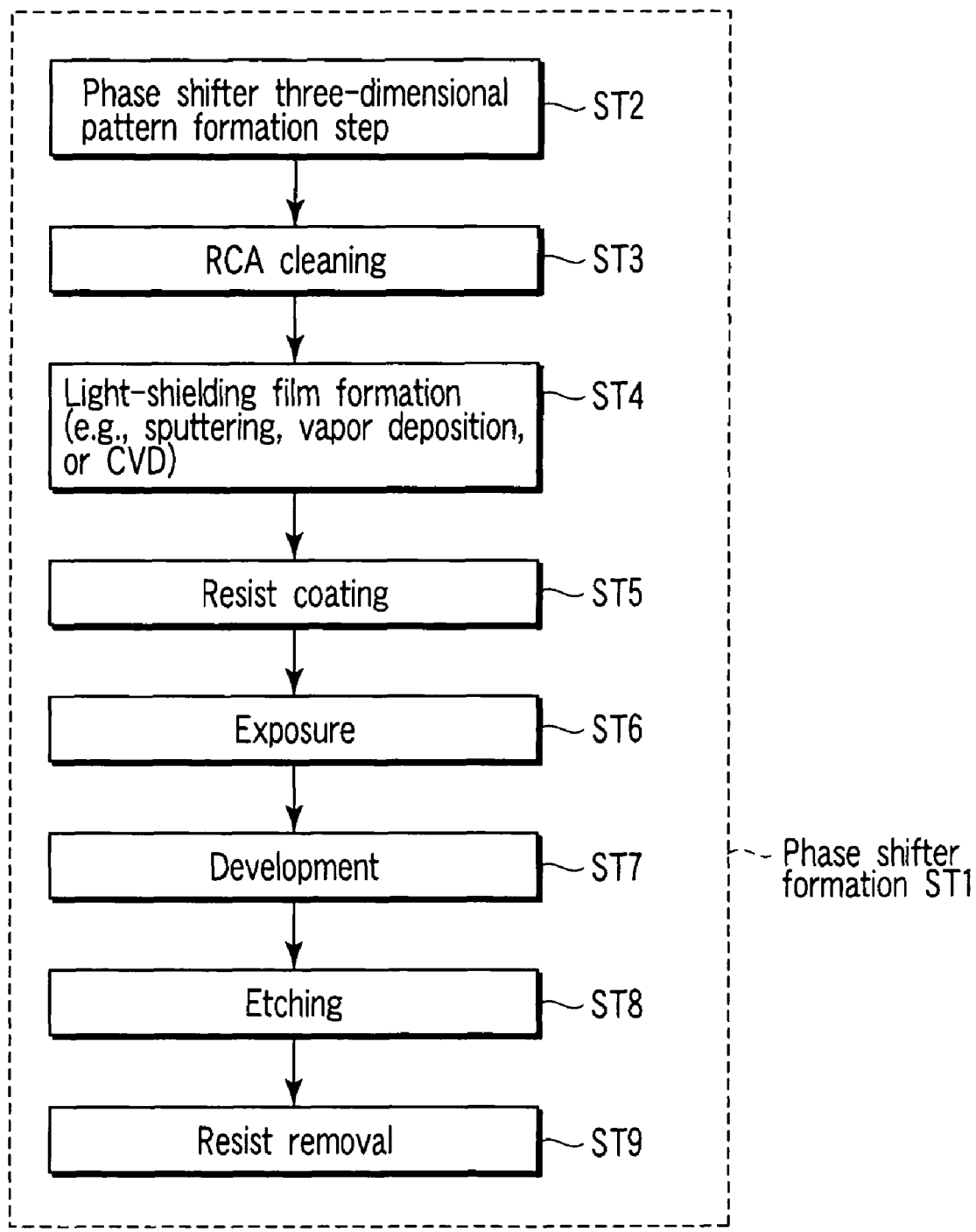
FIG. 4 is a flowchart for explaining a method of fabricating the phase shifter shown in FIGS. 1A to 1D in order of steps.

An embodiment of a method of fabricating a phase shifter 1 will be explained below with reference to FIGS. 4, 5A to 5D, and 6A to 6F. The same reference numerals as in FIGS. 1A to 1D, 2A to 2D, and 3 denote the same parts, and a detailed explanation thereof will be omitted. This embodiment is a method of fabricating the phase shifter having a light-transmitting substrate 2 and a modulator which modulates the phase of incident light entering the light-transmitting substrate 2, i.e., a method by which a light-shielding means for shielding peripheral light in an irradiation surface of incident light to a light-transmitting substrate 2 is formed in the incident optical path or exit optical path of the light-transmitting substrate 2. "Peripheral portion in the irradiation surface" means the portion where the optical intensity decreases, contrary to the region in the central portion of the irradiation surface where the optical intensity of the incident light is uniform, as explained in FIG. 1A. FIG. 4 shows flowchart (ST1) for explaining the fabrication steps of the phase shifter 1. FIGS. 5A to 5D are sectional views for explaining the fabrication method of the phase shifter in order of steps.

Figure 5A:
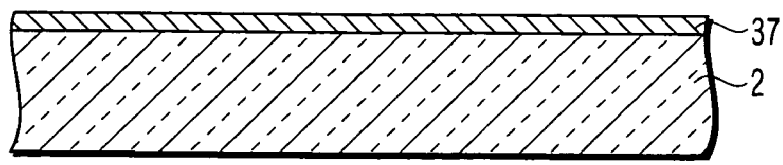
FIG. 5A is a view for explaining the method of fabricating the phase shifter shown in FIGS. 1A to 1D in order of steps.

First, ordinary phase shifter fabrication steps including a step (step 2 in FIG. 4) of forming a phase modulator 3, e.g., a concavity and convexity pattern which modulates the phase of incident light will be explained. FIGS. 5A to 5D illustrate details of the concavity and convexity pattern formation step. As shown in FIG. 5D, a phase shifter formed by the concavity and convexity pattern formation step comprises a light-transmitting substrate 2 and a light-transmitting film 38 formed on the light-transmitting substrate 2. The concavity and convexity pattern may be a duty modulation pattern or a line and space concavity and convexity pattern 36 made up of one or a plurality of parallel stripes.

The light-transmitting substrate 2 is made of glass, quartz, synthetic quartz and the like. The light-transmitting film 38 is made of a material equivalent to that of the light-transmitting substrate 2.

As a means for modulating the phase of the incident laser beam 10, a predetermined concavity and convexity pattern is formed on the light-transmitting substrate 2. The steps of the concavity and convexity pattern 36 is so set as to have a phase difference of, e.g., 90° to the wavelength of an XeCl excimer laser beam or the like used in laser annealing.

A practical fabrication example of the phase shifter having the concavity and convexity pattern 36 will be explained below. Initially, as shown in FIG. 5A, a light-transmitting substrate 2, e.g., a square synthetic quartz substrate of 5-inch side is prepared. On the light-transmitting substrate 2, an amorphous silicon film 37 for forming a phase modulator 3 is formed by plasma CVD so as to cover one surface of the light-transmitting substrate 2. The thickness of the amorphous silicon film 37 is set to, e.g., 75 nm by taking the above-mentioned phase difference into consideration.

Figure 5B:
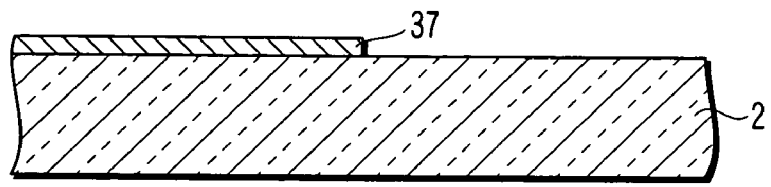
FIG. 5B is a view for explaining the method of fabricating the phase shifter shown in FIGS. 1A to 1D in order of steps.

After the film formation described above, photolithography of a phase modulation pattern, e.g., a line & space pattern is performed, and the amorphous silicon film 37 is patterned on the light-transmitting substrate 2 by chemical dry etching (CDE) such that a portion of the amorphous silicon film 37 is left behind as shown in FIG. 5B.

Figure 5C:
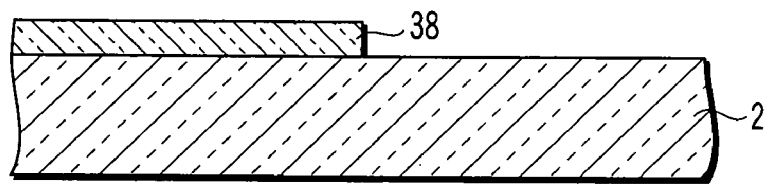
FIG. 5C is a view for explaining the method of fabricating the phase shifter shown in FIGS. 1A to 1D in order of steps.
Figure 5D:
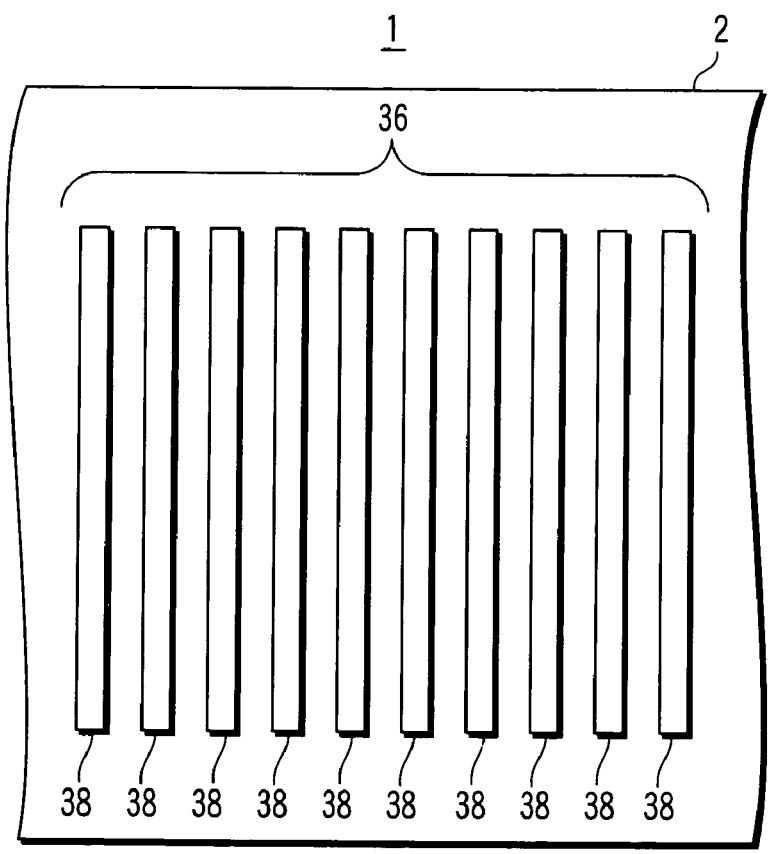
FIG. 5D is a view for explaining the method of fabricating the phase shifter shown in FIGS. 1A to 1D in order of steps.

After the patterning, the amorphous silicon film 37 is heated by annealing. In this annealing process, the amorphous silicon film 37 is wet-oxidized at 1,050° C. for 60 min to change into a silicon oxide film 38 which is a light-transmitting film about 150 nm thick as shown in FIG. 5C. In this manner, a phase shifter as shown in FIG. 5D is fabricated. Although FIG. 5D shows the squared-off portions as the convex portions of the silicon oxide film 38, they are not limited to the above, but the squared-off portions may be given, e.g., by the concave portions. In this case, the peripheral portion around the squares is the silicon oxide film 38, although it is not illustrated.

The above method forms the concavity and convexity pattern having a good step shape by using the amorphous silicon film 37 having a high selectivity to the light-transmitting substrate 2, e.g., quartz. In this method, the amorphous silicon film 37 has a high etching selectivity to quartz as the light-transmitting substrate 2. Therefore, if the film thickness distribution of the amorphous silicon film 37 falls within ±5% on the light-transmitting substrate 2, the phase difference distribution can also fall within ±5% accordingly.

The method of forming the concavity and convexity pattern is not limited to the above method. It is also possible to form the concavity and convexity pattern by directly etching the light-transmitting substrate 2. This method requires highly reproducible etching characteristics which stop etching when a desired step shape is formed, and an etching method having etching rate uniformity over the entire surface.

A method of fabricating a phase shifter 1 with a light-shielding member will be explained below with reference to FIGS. 4 and 6A to 6F. The light-transmitting substrate 2 of the phase shifter explained with reference to FIGS. 5A to 5D is a material, e.g., a synthetic quartz substrate having transparency to the incident laser beam 10. The concavity and convexity pattern which shifts the phase of the incident laser beam 10 is formed on the surface of the substrate made of synthetic quartz (step 2 in FIG. 4). The phase shifter is cleaned by RCA in order to remove contamination and the like (step 3 in FIG. 4). The RCA cleaning is a cleaning method performed by consecutive processing of SC-1 processing (solution mixture processing using $NH_3/H_2O_2/H_2O$ at 85° C.) and SC-2 processing (solution mixture processing using $HCl/H_2O_2/H_2O$ at 85° C.). Although the RCA cleaning is a cleaning method effective to remove contaminants (e.g., particles, fats and fatty oils, and metal contaminants) on the surface of an object to be cleaned, the temperature of the processing solution is not limited to 85° C. Also, the pre-processing is not limited to the RCA cleaning and need only be a cleaning method capable of cleaning an object to be cleaned.

Figure 6A:
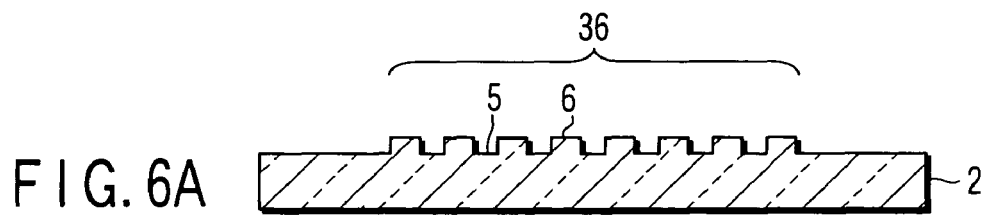
FIG. 6A is a sectional view for explaining the method of fabricating the phase shifter shown in FIGS. 1A to 1D in order of steps.
Figure 6B:
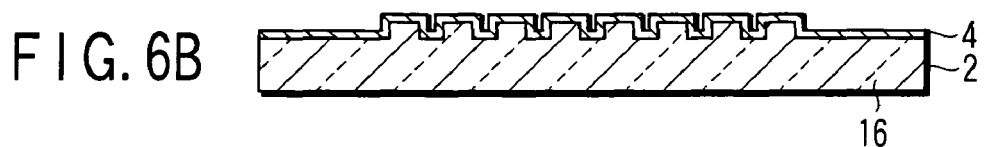
FIG. 6B is a sectional view for explaining the method of fabricating the phase shifter shown in FIGS. 1A to 1D in order of steps.

FIGS. 6A to 6F are sectional views for explaining, in order of steps, the method of fabricating a phase shifter 1 with a light-shielding member from the phase shifter fabricated by the above method. FIG. 6A is a sectional view of the phase shifter having undergone the RCA cleaning after being fabricated by the method shown in FIGS. 5A to 5D. FIG. 6B is a sectional view showing the state in which a light-shielding means is formed on the concavity and convexity pattern of the phase shifter. This light-shielding means is obtained by forming, i.e., a metal thin film on the phase shifter (step 4 in FIG. 4). This film formation method uses sputtering, vapor deposition, CVD, or the like to form, e.g., an aluminum film, aluminum alloy film, chromium film, or another metal film as a film having a high etching selectivity to the light-transmitting substrate 2 made of synthetic quartz and also having properties of shielding the incident laser beam 10.

"Light shielding" by the light-shielding means does not mean 100% light shielding, i.e., perfect shielding of incident light, and may also be light shielding by which incident light is selectively reduced in accordance with the characteristics shown in FIG. 3, thereby transmitting a certain predetermined amount of the incident light. That is, if a substrate to be crystallized, e.g., an amorphous silicon substrate is neither melted nor crystallized even when irradiated with the laser beam 10 which is not completely shielded but is obtained by reducing the optical intensity of the incident light, no insufficient crystallization (to be described later) occurs, so the same effect as when the laser beam is completely shielded can be obtained. Accordingly, "light shielding" herein mentioned does not mean perfect light shielding but includes light reduction to such an extent that no crystallization occurs. An example in which an Al—Si film is formed on the substrate 2 will be explained.

As a step of forming the Al—Si film, a film formation step using, e.g., sputtering will be described below. First, a light-transmitting substrate 2, i.e., a synthetic quartz substrate as a substrate to be processed is loaded into and set in a DC magnetron sputter in which an Al—Si plate is set as a target, a gas such as argon gas is set at a flow rate of 100 sccm, and the pressure is set at 3 mtorr. A 300-nm thick film is formed on the entire surface of the substrate 2, that is, the synthetic quartz substrate by DC magnetron sputtering as shown in FIG. 6B.

Figure 6C:
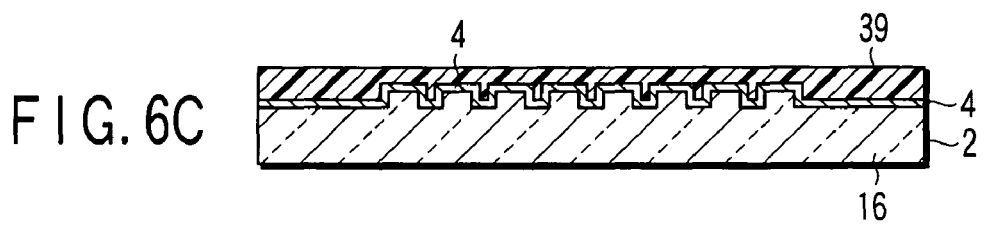
FIG. 6C is a sectional view for explaining the method of fabricating the phase shifter shown in FIGS. 1A to 1D in order of steps.

As shown in FIG. 6C, a resist coating step (step 5 in FIG. 4) is executed after the Al—Si film as a light-shielding portion 4 is formed. As shown in the sectional view of FIG. 6C, the Al—Si film is coated with a resist film 39 by spin coating or the like. Exposure step 6 is executed to form a desired light-shielding region on the Al—Si film. In exposure step 6, the synthetic quartz substrate is set by positioning in, e.g., an exposure apparatus. An exposure mask is a light shielding member formation mask which has a light-shielding portion for shielding incident light in a predetermined peripheral portion of the concavity and convexity pattern and in the peripheral portion of the synthetic quartz substrate, and forms a through hole portion in the central portion except for the peripheral portion. That is, in exposure step 6, the resist film 39 is exposed while the through hole portion is aligned.

Figure 6D:
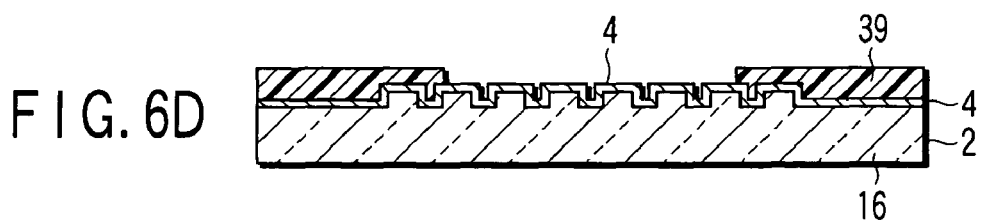
FIG. 6D is a sectional view for explaining the method of fabricating the phase shifter shown in FIGS. 1A to 1D in order of steps.

In the exposure step (step 6 in FIG. 4) and a development step (step 7 in FIG. 4), an unnecessary portion of the resist film 39 in the through hole portion is removed to form a pattern of the resist film 39 as shown in FIG. 6D. As a consequence, the Al—Si film is exposed to the through hole portion from which the resist film is removed.

Figure 6E:
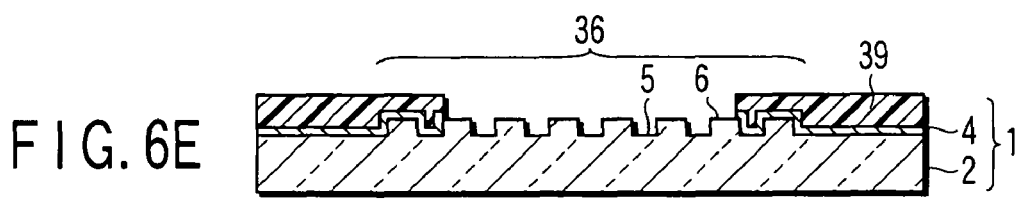
FIG. 6E is a sectional view for explaining the method of fabricating the phase shifter shown in FIGS. 1A to 1D in order of steps.

An etching step (step 8 in FIG. 4) of removing the exposed Al—Si film, e.g., a reactive plasma etching or wet etching step is performed using the pattern of the resist film 39 as a mask. For example, a wet etching solution having a high selectivity to the phase shifter shown in FIG. 6A is used. This makes it possible to etch away only the exposed portion of the Al—Si film without inflicting any damage on the phase-shift, concavity and convexity pattern 36 formed on the surface of the phase shifter, thereby forming a light-shielding portion 4 (FIG. 6E).

The Al—Si film is wet-etched by using an aqueous iodine/potassium iodide solution. This solution strongly etches a chromium film, but hardly etches synthetic quartz. Accordingly, the Al—Si film is etched with a high selectivity to the synthetic quartz. The wet etching solution is not limited to the aqueous iodine/potassium iodide solution, and need only be an etching solution by which the Al—Si film has selectivity to the synthetic quartz and phase-shift, concavity and convexity pattern.

Also, when a metal film other than the Al—Si film, a semiconductor film, an insulator film, or the like is to be used as a light-shielding member, a favorable light-shielding member can be formed by using an etching solution having selectivity to the substrate made of synthetic quartz and phase-shift, concavity and convexity pattern 36.

The foregoing is wet etching. A method of removing the Al—Si film by dry etching such as reactive plasma etching will be explained below. The phase shifter having the Al—Si film with a resist pattern is loaded into a parallel plate RF reactive ion etching apparatus. A gas mixture of 60 sccm of dichloromethane gas and 40 sccm of oxygen is supplied as an etching gas made of a chlorine-based gas, and reactive ion etching is performed by setting the pressure at, e.g., 10 mtorr. By this etching process, the phase shifter 1 is formed. The plasma etching gas for the metal film is not limited to the etching gas made of a chlorine-based gas, and plasma etching using another etching gas may also be performed. The light-shielding member having undergone the wet etching or dry etching descried above has an annular shape having a light-transmitting portion in the central portion.

Figure 6F:
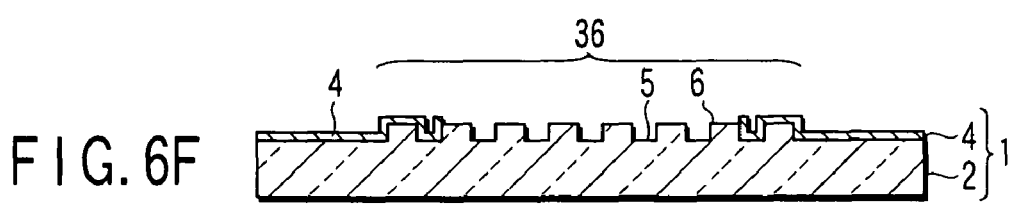
FIG. 6F is a sectional view for explaining the method of fabricating the phase shifter shown in FIGS. 1A to 1D in order of steps.

After that, resist removing step 9 is executed. As shown in FIG. 6F, the resist film 39 is removed, and cleaning is performed (step 9 in FIG. 4). In this manner, the light-shielding-member-integrated phase shifter 1 having the light-shielding portion 4 can be fabricated.

An embodiment of a crystallization apparatus using the phase shifter 1 will be explained below with reference to FIGS. 7, 8A, and 8B. The same reference numerals as in FIGS. 1A to 6F denote the same parts. The crystallization apparatus of this embodiment is an apparatus which irradiates a substrate 45 to be crystallized on a suscepter with a laser beam from a laser source via a homogenizing optical system and phase shifter, thereby crystallizing the irradiated surface. The phase shifter has a phase modulator formed on a light-transmitting substrate, and a light-shielding portion formed in the incident optical path of the light-transmitting substrate. The light-shielding portion shields peripheral light in the irradiation surface of incident light.

A crystallization apparatus 41 includes an illuminating system 42, a phase modulation device such as a phase shifter 1 formed on the optical axis of the illuminating system 42, an image formation optical lens system 44, and a suscepter 46 for supporting the substrate 45 to be crystallized.

Figure 8A:
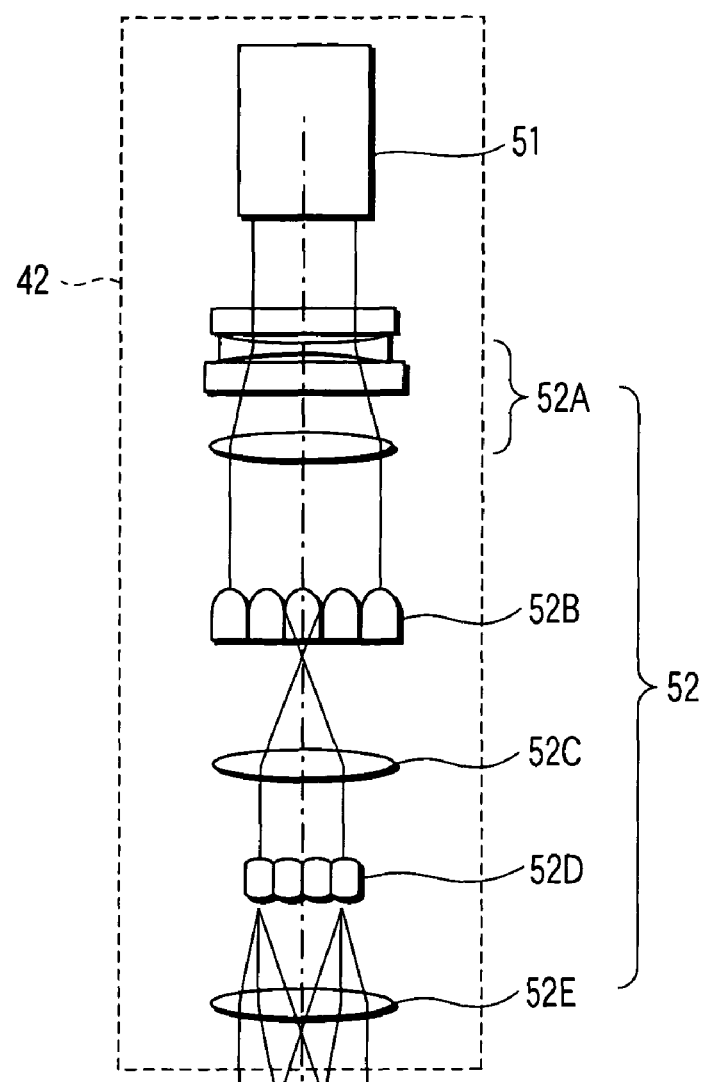
FIG. 8A is a view for explaining the arrangement of an illuminating system shown in FIG. 7.

The illuminating system 42 is an optical system shown in FIG. 8A, and includes a light source 51 and homogenizing optical system 52. The light source 51 includes an XeCl excimer laser source which emits a pulse laser beam having a wavelength of, e.g., 308 nm. Note that other optimum examples of the light source 51 are excimer lasers such as a KrF excimer laser which emits a pulse laser beam having a wavelength of 248 nm, and an ArF excimer laser which emits a pulse beam having a wavelength of 193 nm. The light source 51 may also be a YAG laser source. The light source 51 is also possible to use another appropriate light source which outputs energy for melting a non-single-crystal semiconductor film 45C, e.g., an amorphous silicon film formed on the substrate 45 to be crystallized. The homogenizing optical system 52 is formed on the optical axis of the laser beam emitted from the light source 51.

In the homogenizing optical system 52, a beam expander 52A, first fly-eye lens 52B, first condenser optical system 52C, second fly-eye lens 52D, and second condenser optical system 52E are arranged on the optical axis of the laser beam from the light source 51. The homogenizing optical system 52 homogenizes the optical intensity in the section of the laser beam emitted from the light source 51.

That is, in the illuminating system 42, the incident laser beam from the light source 51 is shaped via the beam expander 52A, and enters the first fly-eye lens 52B. A plurality of light sources are formed on the rear focal surface of the first fly-eye lens 52B, and a bundle of rays from these light sources illuminates, by superposition, the incident surface of the second fly-eye lens 52D via the first condenser optical system 52C. As a consequence, a number of light sources larger in number than those formed on the rear focal surface of the first fly-eye lens 52b are formed on the rear focal surface of the second fly-eye lens 52D. A bundle of rays from these light sources formed on the rear focal surface of the second fly-eye lens 52D enters the phase shifter 1 via the second condenser optical system 52E, and illuminates the phase shifter 1 by superposition.

That is, the first fly-eye lens 52B and first condenser optical system 52C of the homogenizing optical system 52 form a first homogenizer, and the second fly-eye lens 52D and second condenser optical system 52E of the homogenizing optical system 52 form a second homogenizer, thereby homogenizing the optical intensity in individual in-plane positions on the phase shifter 1. In this way, the illuminating system 42 forms a laser beam 10 having a substantially uniform optical intensity distribution, and the laser beam 10 irradiates the phase shifter 1 as shown in FIG. 1A.

In this case, the problem is that the homogenizing optical system 52 homogenizes the optical intensity of the laser beam from the light source 51, but the optical intensity is not completely homogenized as shown in FIG. 1A. FIG. 8B shows a laser beam intensity distribution 13 in an irradiation plane b in which the phase shifter 1 is irradiated. In the laser beam intensity distribution 13 shown in FIG. 8B, the optical intensity of the laser beam 10 in the peripheral light 11 is lower than that in a central portion 15 in which the optical intensity is uniform. This decrease in optical intensity in the peripheral light 11 of the laser beam intensity distribution 13 changes the grain size and orientation as described previously, and worsens the electrical characteristics when a transistor is formed.

This embodiment is characterized in that the peripheral light 11 which worsens the electrical characteristics as described above is shielded and prevented from entering the image formation optical lens system 44, thereby improving the uniformity of the crystal grains formed on the crystallized region, hence to improve the uniformity of the electrical characteristics of a transistor formed in the crystallized region. To shield the peripheral light 11 and prevents it from entering the image formation optical lens system 44, a light-shielding means is formed in the optical path from the exit portion of the homogenizing optical system 52 to the incident surface of the image formation optical lens system 44. An optimum example is to form a light-shielding member on at least one of the incident surface and exit surface of the phase shifter 1.

The phase modulation device, e.g., the phase shifter 1 is an optical device which modulates the phase of the exit light from the homogenizing optical system 52, and outputs a laser beam having a minimum optical intensity distribution with an inverse peak pattern. In the inverse-peak-pattern optical intensity distribution, the abscissa indicates the location (the position in the surface to be irradiated), and the ordinate indicates the optical intensity (energy). An example of the optical system for obtaining this inverse-peak-pattern optical intensity distribution is a concavity and convexity pattern formed on the light-transmitting substrate 2, e.g., quartz glass. Examples of this pattern are a line-and-space pattern and area modulation pattern, e.g., duty modulation pattern.

The phase shifter 1 of this embodiment is an optical element in which steps are repetitively periodically formed. The width of the phase shift pattern is, e.g., 25 μm. The phase difference need not be 90°, i.e., need only be a phase difference capable of increasing and decreasing the intensity of a laser beam.

The irradiation light 20 having the phase modulated by the phase shifter 1 strikes the substrate 45 to be crystallized via the image formation optical lens system 44. In the image formation optical lens system 44, the pattern surface of the phase shifter 1 and the substrate 45 to be crystallized are optically conjugated. In other words, the height of the suscepter 46 is corrected such that the substrate 45 to be crystallized is set on a plane (the image plane of the image formation optical lens system 44) which is optically conjugated to the pattern surface of the phase shifter 1. The image formation optical lens system 44 has an aperture stop 44C between positive lenses 44A and positive lenses 44B. The image formation optical lens system 44 is an optical lens which forms an image of the phase shifter 1 on the substrate 45 to be crystallized, without changing the magnification of the image or by reducing the image to, e.g., ⅕.

The aperture stop 44C has a plurality of aperture stops different in size of an aperture (light-transmitting portion) so as not to use light in the peripheral portion where the characteristics of the positive lenses 44A and positive lenses 44B deteriorate.

Figure 7:
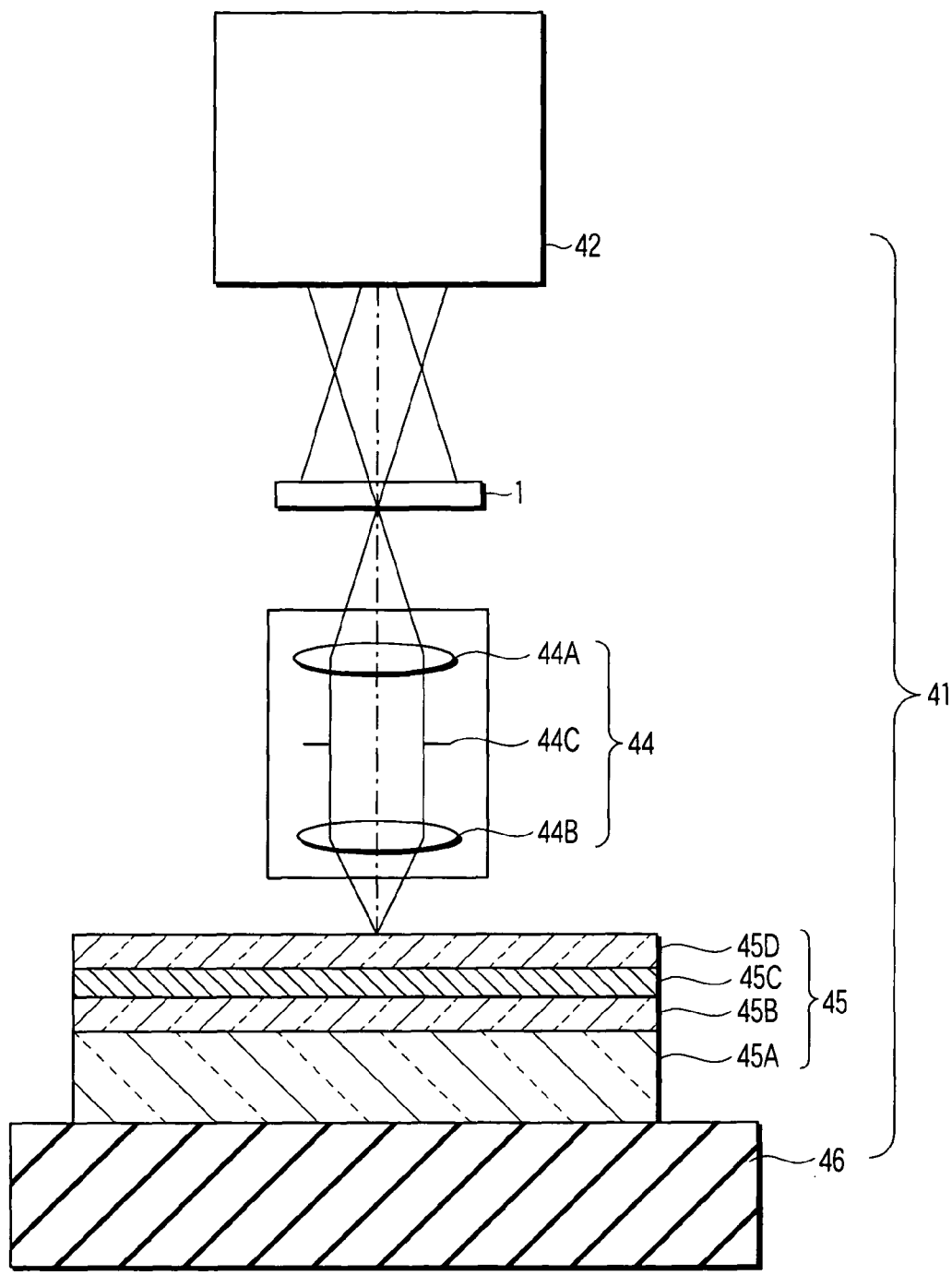
FIG. 7 is a sectional view for explaining an embodiment of a crystallization apparatus of the present invention.

Also, the substrate 45 to be crystallized has a stacked structure as shown in FIG. 7. On a glass substrate 45A which is, e.g., plate glass for a liquid crystal display, a silicon oxide layer is formed as an underlying insulating layer 45B by chemical vapor deposition (CVD) or sputtering. On the underlying insulating layer 45B, a non-single-crystal semiconductor film 45C such as an amorphous silicon film is formed as a layer to be crystallized for forming at thin-film transistor. On the non-single-crystal semiconductor film 45C, a silicon oxide layer 45D having a heat storage effect is formed as a cap film. The underlying insulating layer 45B is, e.g., a 200- to 1,000-nm thick $SiO_2$ film. The underlying insulating layer 45B prevents direct contact between the non-single-crystal semiconductor film 45C, e.g., an amorphous silicon and the glass substrate 45A, thereby preventing foreign matter such as Na precipitated from the glass substrate 45A from mixing into the amorphous silicon film 45C. The underlying insulating layer 45B also prevents the melting temperature in the step of crystallizing the amorphous silicon film 45C from being directly conducted to the glass substrate 45A, thereby contributing to crystallization of large grains by the effect of storing the melting temperature.

The amorphous silicon film 45C is a film which is crystallized when irradiated with light, and the film thickness is, e.g., 30 to 250 nm. The cap film 45D stores the heat generated when the amorphous silicon film 45C is melted in the crystallization step, and prevents the irradiated region of the amorphous silicon film 45C from rapidly cooling when the laser beam is shielded. This heat storage function contributes to the formation of a large-grain-size crystallized region. The cap film 45D is an insulating film, e.g., a silicon oxide film ($SiO_2$), and the film thickness is 100 to 400 nm, e.g., 200 nm.

After the cap film is formed, annealing is performed at 500° C. for 2 hrs in order to decrease the hydrogen concentration in the amorphous silicon film.

The crystallization process will be explained below with reference to FIGS. 7, 8A, and 8B. The pulse laser beam emitted from the light source 51, e.g., a laser source enters the homogenizing optical system 52, and the optical intensity is homogenized within the beam diameter of the laser beam.

The laser beam is an XeCl excimer laser beam having a wavelength of 308 nm, and the pulse continuation time of one shot is 30 nsec. When the phase shifter 1 is irradiated with the pulse laser beam under the above conditions, a periodically changing optical intensity distribution of an inverse peak pattern is generated, for example.

Figure 8B:
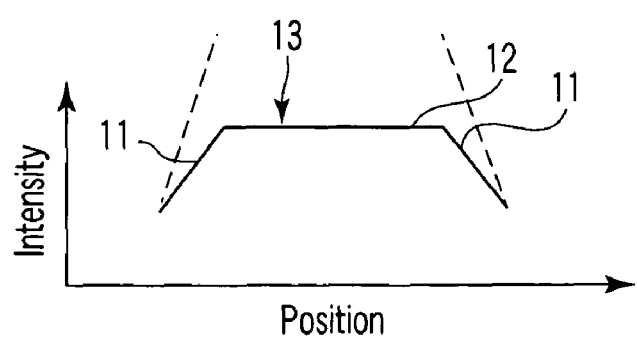
FIG. 8B is a view for explaining the arrangement of the illuminating system shown in FIG. 7.

Of the laser beam entering the phase shifter 1, i.e., the exit beam from the homogenizing optical system 52, the peripheral light 11 as shown in FIG. 8B exists, so a means for shielding the peripheral light 11 is formed in, e.g., the phase shifter 1.

This optical intensity distribution having the inverse peak pattern desirably outputs laser beam intensity which melts the amorphous silicon layer 45C from the minimum optical intensity to the maximum optical intensity. The irradiation beam having passed through the phase shifter 1 is irradiated on the amorphous silicon film 45C of the substrate 45 to be crystallized by the image formation optical system 44.

The laser beam having irradiated the substrate 45 to be crystallized is mostly transmitted through the silicon oxide film 45D as a cap film, and absorbed by the amorphous silicon film 45C. This heats and melts the irradiated region of the amorphous silicon film 45C. The melting heat is stored in the silicon oxide films 45B and 45D.

When the irradiation with the pulse laser beam is completed, the irradiated region tends to cool at high speed, but the cooling rate is made extremely low by the heat stored in the silicon oxide films of the cap film 45D and underlying insulating layer 45B. In this case, the irradiated region cools such that a low-optical-intensity portion cools and solidifies in accordance with the inverse-peak-pattern optical intensity distribution generated by the phase shifter 1, and the crystal sequentially grows as the solidification position sequentially moves in the lateral direction toward a high-optical-intensity portion.

In other words, the solidification position in the melted region in the irradiated region gradually sequentially moves from the low-temperature side to the high-temperature side. That is, the crystal grows in the lateral direction from the crystal growth start position to the crystal growth end position. In this manner, the crystallization step by the laser beam of one pulse is completed. The crystallized region thus grown has an enough size to form one or a plurality of thin-film transistors.

The crystallization apparatus 41 automatically irradiates a region to be crystallized of the next amorphous silicon film 45C with the pulse laser beam in accordance with a prestored program, thereby forming a crystallized region. The next crystallization position can be selected by moving the substrate 45 to be crystallized and light source 51 relative to each other, e.g., moving the sample suscepter 46.

When the region to be crystallized is selected and orientation is completed, the next pulse laser beam is emitted. A broad range of the substrate 45 to be crystallized can be crystallized by thus repeating the shot of the laser beam. In this way, the crystallization step is completed.

In the above embodiment, the light-shielding portion 4 is directly formed on the incident surface or exit surface of the phase shifter 1 in order to shield the peripheral light 11. However, the light-shielding means may shield the peripheral light 11 in any position of the optical path between the exit surface of the homogenizer 52 and the incident surface of the image formation optical system 44. The light-shielding means may also be formed in a plurality of portions, instead of one portion, of the optical path between the incident surface and exit surface of the phase shifter 1, i.e., between the exit surface of the homogenizer 52 and the incident surface of the image formation optical system 44.

Figure 9A:
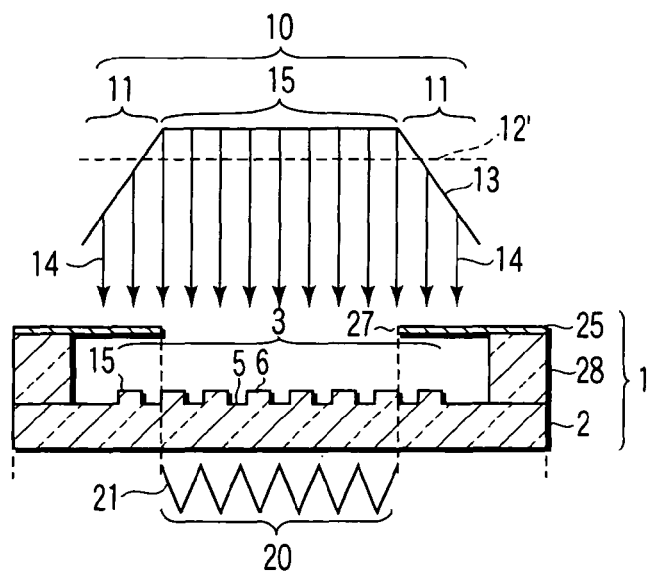
FIG. 9A is a view for explaining another embodiment of FIGS. 1A to 1D and 2A to 2D.
Figure 9B:
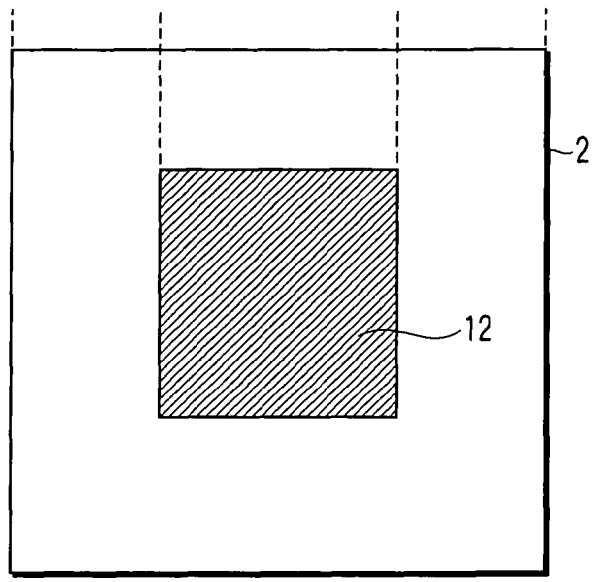
FIG. 9B is a view for explaining another embodiment of FIGS. 1A to 1D and 2A to 2D.

For example, as shown in FIG. 9A, the light-shielding means may also be formed in the laser beam 10 which enters the optical path, e.g., the incident optical path of the phase shifter 1. This embodiment is an example in which at least one light-shielding member 25 is formed as a light-shielding means between the exit surface of the homogenizing optical system, e.g., the homogenizer 52 and the incident surface of the image formation optical lens system 44. The light-shielding member 25 is an annular light-shielding member having, e.g., a square through hole 27. The same reference numerals as in FIGS. 1A to 8B denote the same parts, and a repetitive explanation thereof will be omitted. FIG. 9A shows the state in which the light-shielding member 25 shields the peripheral light 11 having a low optical intensity of the pulse laser beam 10 striking from the homogenizer 52, and the laser beam 10 transmitted through the through hole 27 enters the phase shifter 1. FIG. 9B is a plan view showing an irradiation region 12 defined by the phase shifter 1.

Figure 9C:
FIG. 9C is a view for explaining another embodiment of FIGS. 1A to 1D and 2A to 2D.
Figure 9D:
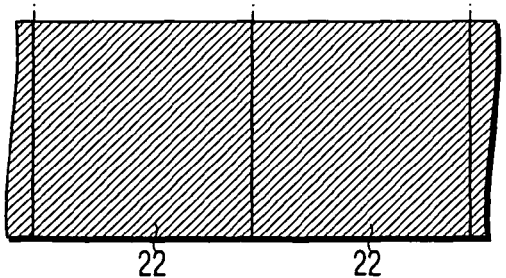
FIG. 9D is a view for explaining another embodiment of FIGS. 1A to 1D and 2A to 2D.

In this case, as shown in FIGS. 9C and 9D, no irradiated region showing insufficient crystallization is formed in the substrate 45 to be crystallized, and only good adjacent crystallized regions 22 are continuously formed or overlapped.

The above embodiments have described a case in which the optical intensity distribution 21 is the inverse peak pattern. This time, the embodiments in which the optical intensity distribution 21 is a normal peak pattern will be explained with reference to FIGS. 10A to 10D. The same reference numerals as in FIGS. 1A to 1D denote the same parts, and a detailed explanation thereof will be omitted.

Figure 10A:
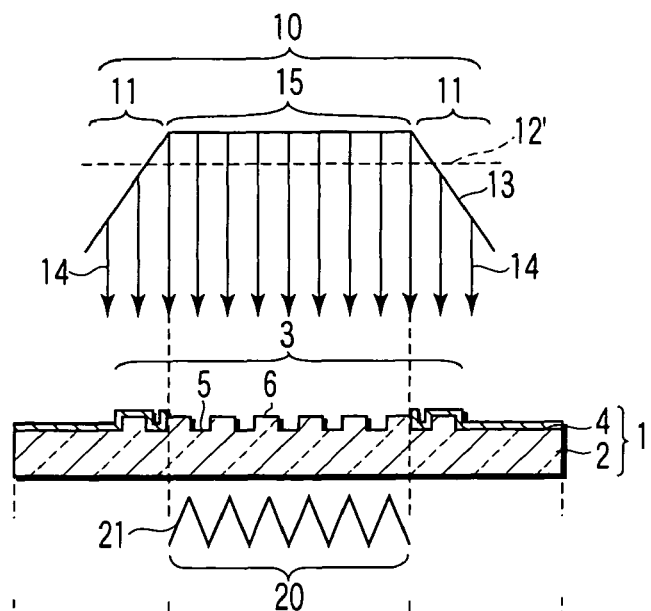
FIG. 10A is a view for explaining another embodiment of FIGS. 1A to 1D, 2A to 2D, and 9A to 9D.
Figure 10B:
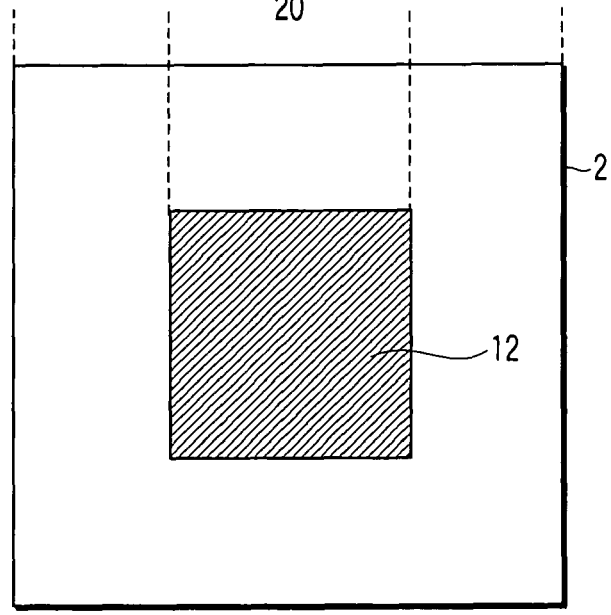
FIG. 10B is a view for explaining another embodiment of FIGS. 1A to 1D, 2A to 2D, and 9A to 9D.
Figure 10C:
FIG. 10C is a view for explaining another embodiment of FIGS. 1A to 1D, 2A to 2D, and 9A to 9D.
Figure 10D:
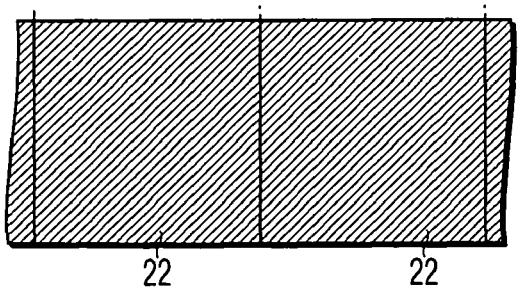
FIG. 10D is a view for explaining another embodiment of FIGS. 1A to 1D, 2A to 2D, and 9A to 9D.

The normal peak pattern means the triangle waves arranged such that the intensity of the irradiation laser beam 20 becomes the minimum in the end portions of the optical intensity distribution 21, as shown in FIGS. 10A and 10C. In FIG. 10C, the optical intensity of the portions adjacent to the optical intensity distribution 21 in the normal peak pattern becomes the minimum. Crystallization experiments were performed on these two optical intensity distributions to evaluate the uniformity of their crystal grains, and it was found that the optical intensity distribution 21 in the normal peak pattern is superior to that in the inverse peak pattern.

Figure 11A:
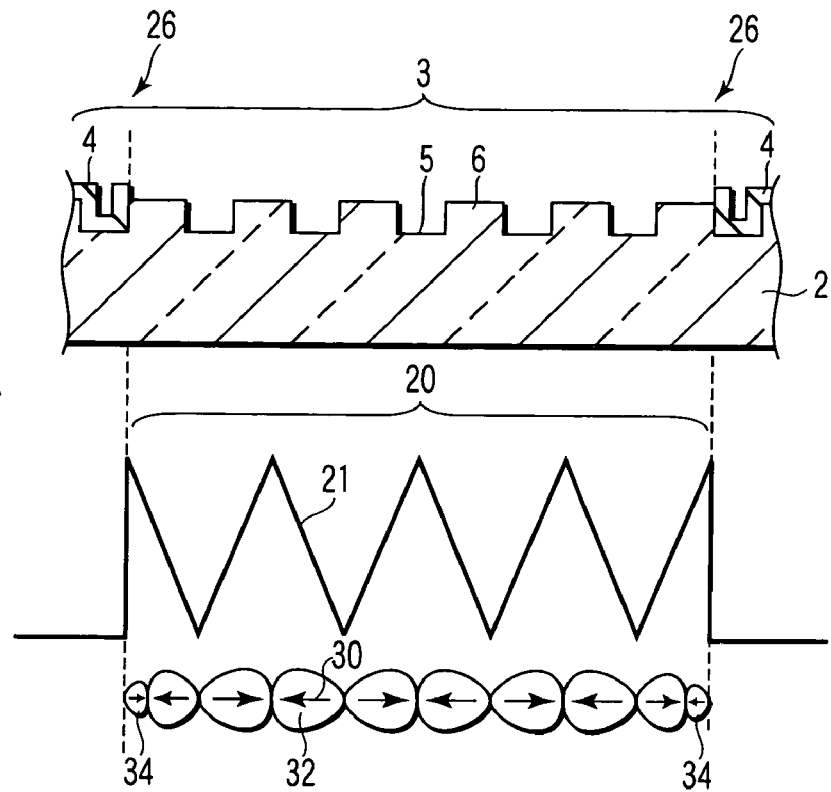
FIG. 11A is a view showing the optical intensity distribution per one shot when the optical intensity distribution is the inverse peak pattern and a schematic view indicating the crystallization growth by SEM in the portion corresponding to the optical intensity distribution.

This reason will be explained using FIGS. 11A and 11B. FIG. 11A shows the optical intensity distribution (the upper portion of FIG. 11A) per one shot when the optical intensity distribution 21 is the inverse peak pattern and a schematic view (the lower portion of FIG. 11A) indicating the crystallization growth by SEM in the portion corresponding to the optical intensity distribution. This schematic view shows the crystal grains 32 and the direction 30 of the crystallization growth. Around the central portion of the optical intensity distribution 21, every lower optical intensity portion decreases in temperature and solidifies, based on the optical intensity distribution of the inverse peak pattern generated by the phase shifter 1, and solidification portion sequentially moves toward the higher optical intensity portion where a temperature is high, in the horizontal direction, hence to form the crystal grains 32 densely.

The end portions 26, however, are shielded by the end portions of the opening of the light-shielding member, although they have the maximum optical intensity, and therefore, the optical intensity thereof rapidly decreases. Accordingly, it is observed that the crystal grains 34 which respectively grow around the end portions 26 are a little smaller than the crystal grains 32.

Even though there exist these crystal grains 34, the crystallization growth is densely achieved on the whole surface. This is because the peripheral light 11 which worsens the crystallization or does not grow the crystal is shielded and the irradiation step is densely performed on the adjacent regions in a square shape.

Figure 11B:
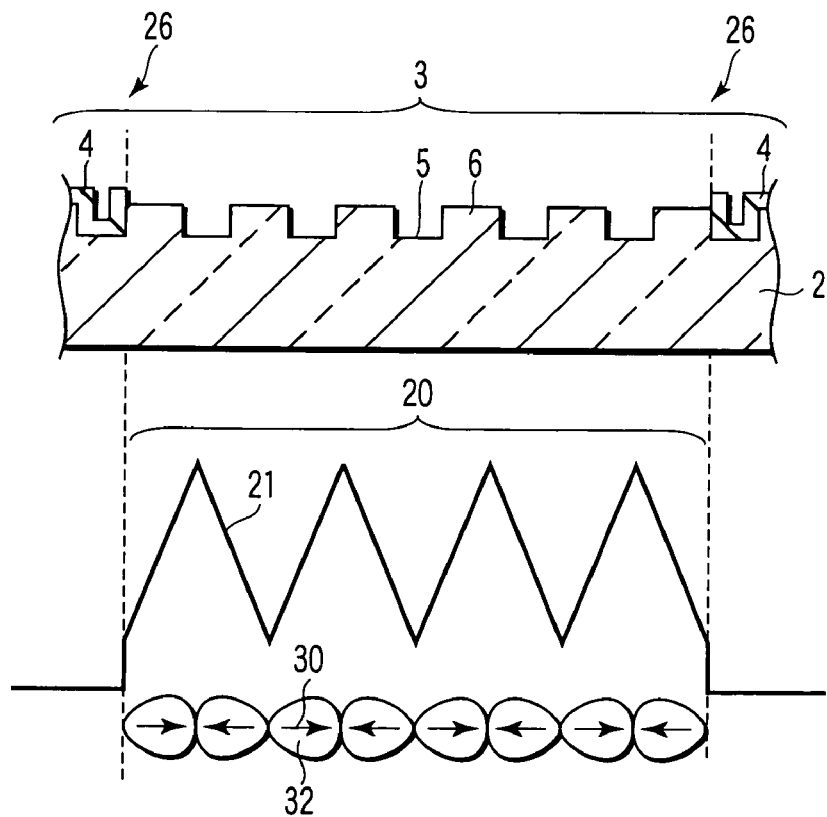
FIG. 11B is a view showing the optical intensity distribution per one shot when the optical intensity distribution is the normal peak pattern and a schematic view of the crystallization growth by SEM in the portion corresponding to the optical intensity distribution.

The crystallization growth of the normal peak pattern is shown in FIG. 11B. FIG. 11B is a view showing the optical intensity distribution (the upper portion of FIG. 11B) per one shot when the optical intensity distribution 21 is the normal peak pattern and a schematic view (the lower portion of FIG. 11B) of the crystallization growth by SEM in the portion corresponding to the optical intensity distribution. No crystal grain 34 is found in the end portion 26 but the same crystal grain 32 growing in the central portion is observed also in the end portion 26. This is because the optical intensity in the optical intensity distribution is the minimum in the end portion, without a rapid fall of the optical intensity, and the same crystallization growth mechanism works also in the end portion 26 as that in the central portion.

Therefore, the uniformity of the crystal grains in the optical intensity distribution of the normal peak pattern is superior to that in the optical intensity distribution of the inverse peak pattern.

In the above, the case where the accuracy of the opening of the light-shielding member is correct has been described. A small deviation in the accuracy does not matter practically.

The light-shielding member explained in the above embodiments is not limited to a thin film formed on the incident surface or exit surface of the phase shifter 1, and may also be a light-shielding member which is held to have a predetermined spacing with the phase shifter 1 as a phase modulation device, by inserting a spacer 28 or the like or by using a tool for holding the predetermined spacing.

Furthermore, in the above embodiments, not only crystallized regions having a uniform size are formed, but also no non-crystallized regions are little generated around the crystallized regions. Additionally, thin-film transistors having uniform characteristics can be formed over a broad range in the thus crystallized region. Consequently, when an imaging element or a display device such as an active matrix type liquid crystal display device is formed, it is possible to fabricate hundreds of thousands of thin-film transistors with uniform characteristics, and display uniform images.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A crystallization method in which a laser beam from a laser source irradiates a substrate to be processed on a suscepter via a homogenizing optical system, a phase modulation device, and an image formation optical lens system, thereby crystallizing an irradiated surface, comprising:
    forming a laser beam by shielding low-optical-intensity peripheral light of the laser beam on an exit surface of the homogenizing optical system by means of a light-shielding portion provided on the phase modulation device, in an optical path between the exit surface of the homogenizing optical system and an incident surface of the image formation optical lens system.

2. A crystallization method in which a laser beam from a laser source irradiates a substrate to be processed on a suscepter via a homogenizing optical system, a phase modulation device, and an image formation optical lens system, thereby crystallizing an irradiated surface, comprising:
    forming a laser beam by shielding low-optical-intensity peripheral light of the laser beam on an exit surface of the homogenizing optical system by means of a light-shielding portion, in an optical path between the exit surface of the homogenizing optical system and an incident surface of the image formation optical lens system,
    wherein the laser beam which has passed through the phase modulation device and the light-shielding portion has an optical intensity having a triangular section and being substantially the same at each end of the laser beam.

3. The crystallization method of claim 2, wherein the optical intensity of the each end of the laser beam is a maximum value of an optical intensity distribution of the triangular section.

4. The crystallization method of claim 2, wherein the optical intensity of the each end of the laser beam is a minimum value of an optical intensity distribution of the triangular section.

* * * * *